United States Patent
Gao

(10) Patent No.: US 12,341,082 B2
(45) Date of Patent: Jun. 24, 2025

(54) CHIP COOLING PACKAGE WITH MULTIPLE FLUID PATHS

(71) Applicant: Baidu USA LLC, Sunnyvale, CA (US)

(72) Inventor: Tianyi Gao, Sunnyvale, CA (US)

(73) Assignee: Baidu USA LLC, Sunnyvale, CA (US)

( * ) Notice: Subject to any disclaimer, the term of this patent is extended or adjusted under 35 U.S.C. 154(b) by 699 days.

(21) Appl. No.: 17/396,313

(22) Filed: Aug. 6, 2021

(65) Prior Publication Data
US 2023/0040828 A1   Feb. 9, 2023

(51) Int. Cl.
*H01L 23/473* (2006.01)
*F28F 3/14* (2006.01)
*H01L 21/48* (2006.01)
*H01L 23/427* (2006.01)

(52) U.S. Cl.
CPC ............. *H01L 23/473* (2013.01); *F28F 3/14* (2013.01); *H01L 21/4882* (2013.01); *H01L 23/427* (2013.01)

(58) Field of Classification Search
CPC ...... F28F 3/14; H01L 23/473; H01L 21/4882; H01L 23/427
See application file for complete search history.

(56) References Cited

U.S. PATENT DOCUMENTS

| | | | |
|---|---|---|---|
| 840,667 A * | 1/1907 | Speed et al. | F28D 9/0012 165/DIG. 361 |
| 1,413,571 A * | 4/1922 | Bronander | B29C 43/56 165/170 |
| 1,539,887 A * | 6/1925 | Vandergrift | B29C 33/04 165/170 |
| 3,055,642 A * | 9/1962 | Cox | F25D 25/028 62/526 |
| 3,387,653 A * | 6/1968 | Coe | F28F 1/12 219/536 |
| 3,512,582 A * | 5/1970 | Chu | H01L 23/427 174/15.1 |
| 4,085,728 A * | 4/1978 | Tomchak | F24S 10/502 126/669 |
| 5,152,337 A * | 10/1992 | Kawakatsu | F25B 39/022 165/170 |
| 5,198,889 A * | 3/1993 | Hisano | H01L 23/4338 257/E23.094 |

(Continued)

FOREIGN PATENT DOCUMENTS

| | | | | |
|---|---|---|---|---|
| EP | 415584 A | * | 3/1991 | ............ F25B 39/022 |
| GB | 1328372 A | * | 8/1973 | |

*Primary Examiner* — Ljiljana V. Ciric
(74) *Attorney, Agent, or Firm* — WOMBLE BOND DICKINSON (US) LLP

(57) ABSTRACT

A cooling plate for cooling chip having redundant cooling fluid circulation. A primary fluid cooling loop removes heat directly from the chip. A secondary cooling loop acts as a condenser for two phase cells, thus removing heat from the chip indirectly. The cold plate may be fabricated as two parts: bottom plate and top plate where is the fluid is divided to primary stream to the bottom plate and secondary stream to top cooling plate. Two-phase, self-contained cells may be partly immersed in the primary cooling loop and partly immersed in the secondary loop. Fluid ports circulate cooling fluid by having one orifice coupled to the primary cooling loop and one orifice coupled to the secondary cooling loop.

10 Claims, 7 Drawing Sheets

(56) References Cited

U.S. PATENT DOCUMENTS

| | | | |
|---|---|---|---|
| 5,239,200 A * | 8/1993 | Messina | H01L 23/473 361/689 |
| 5,529,115 A * | 6/1996 | Paterson | H01L 23/427 165/104.21 |
| 6,019,165 A * | 2/2000 | Batchelder | H01L 23/427 165/80.4 |
| 6,170,568 B1 * | 1/2001 | Valenzuela | F28F 3/044 165/DIG. 357 |
| 6,209,202 B1 * | 4/2001 | Rhodes | B21C 37/151 165/177 |
| 6,992,382 B2 * | 1/2006 | Chrysler | H01L 23/473 361/689 |
| 6,994,151 B2 * | 2/2006 | Zhou | H01L 23/427 174/15.1 |
| 7,007,506 B2 * | 3/2006 | Kubo | H05K 7/20309 165/170 |
| 7,104,312 B2 * | 9/2006 | Goodson | F28F 3/048 174/15.1 |
| 7,134,484 B2 * | 11/2006 | Mok | F28F 3/12 257/E23.098 |
| 7,306,028 B2 * | 12/2007 | Zuo | F28D 9/0025 165/104.21 |
| 7,316,263 B2 * | 1/2008 | Lofland | H01L 23/473 257/E23.098 |
| 7,506,682 B2 * | 3/2009 | Bhatti | H01L 23/427 165/80.4 |
| 7,549,460 B2 * | 6/2009 | East | F28F 3/12 165/80.4 |
| 7,604,040 B2 * | 10/2009 | Ghosh | H01L 23/473 165/80.4 |
| 7,626,407 B2 * | 12/2009 | Kabbani | H01L 23/473 165/80.4 |
| 7,836,597 B2 * | 11/2010 | Datta | H01L 21/4882 29/890.032 |
| 8,066,057 B2 * | 11/2011 | Olesen | F28F 9/0268 165/80.4 |
| 9,241,423 B2 * | 1/2016 | Chiu | H01L 23/473 |
| 9,357,675 B2 * | 5/2016 | Campbell | B23P 15/26 |
| 9,484,283 B2 * | 11/2016 | Joshi | H01L 23/4735 |
| 9,693,480 B2 * | 6/2017 | Salat | H01L 23/473 |
| 10,224,263 B2 * | 3/2019 | Provenziani | H01L 23/473 |
| 10,976,119 B2 * | 4/2021 | Veto | F28F 5/00 |
| 10,999,955 B2 * | 5/2021 | Wecker | H05K 7/20872 |
| 11,201,102 B2 * | 12/2021 | Parida | F28D 15/046 |
| 11,406,047 B2 * | 8/2022 | Chehade | H05K 7/20327 |
| 11,547,022 B2 * | 1/2023 | Gao | H05K 7/20272 |
| 11,700,709 B2 * | 7/2023 | Gao | H05K 7/20254 361/699 |
| 11,800,682 B2 * | 10/2023 | Lunsman | H05K 7/20272 |
| 11,910,578 B2 * | 2/2024 | Pascualinotto Junior | H05K 7/20254 |
| 11,924,999 B2 * | 3/2024 | Gao | H05K 7/20272 |
| 11,956,922 B2 * | 4/2024 | Gao | H05K 7/20272 |
| 11,968,803 B2 * | 4/2024 | Gao | H05K 7/203 |
| 12,004,332 B2 * | 6/2024 | Moreno | H05K 7/209 |
| 12,057,368 B2 * | 8/2024 | Gao | H01L 23/3672 |
| 12,058,837 B2 * | 8/2024 | Gao | H05K 7/20254 |
| 2004/0050533 A1 * | 3/2004 | Chesser | H05K 7/20009 165/46 |
| 2005/0103472 A1 * | 5/2005 | Lofland | F28F 3/12 257/E23.098 |
| 2005/0128705 A1 * | 6/2005 | Chu | H01L 23/473 361/689 |
| 2007/0050980 A1 * | 3/2007 | Vetter | B23K 11/14 257/E23.098 |
| 2009/0213541 A1 * | 8/2009 | Butterbaugh | H01L 23/473 361/689 |
| 2010/0128436 A1 * | 5/2010 | Edmunds | F28D 15/0233 165/104.26 |
| 2017/0092565 A1 * | 3/2017 | Chen | H05K 7/20281 |
| 2018/0308723 A1 * | 10/2018 | Otani | H01L 21/68742 |
| 2020/0100396 A1 * | 3/2020 | Iyengar | H05K 7/20254 |
| 2020/0132391 A1 * | 4/2020 | Paavola | F28D 15/046 |
| 2020/0315069 A1 * | 10/2020 | Chiu | H05K 7/20772 |
| 2021/0407888 A1 * | 12/2021 | Elsherbini | H01L 23/467 |
| 2022/0065549 A1 * | 3/2022 | Zhou | F28D 15/0275 |
| 2023/0040828 A1 * | 2/2023 | Gao | H01L 23/473 |

* cited by examiner

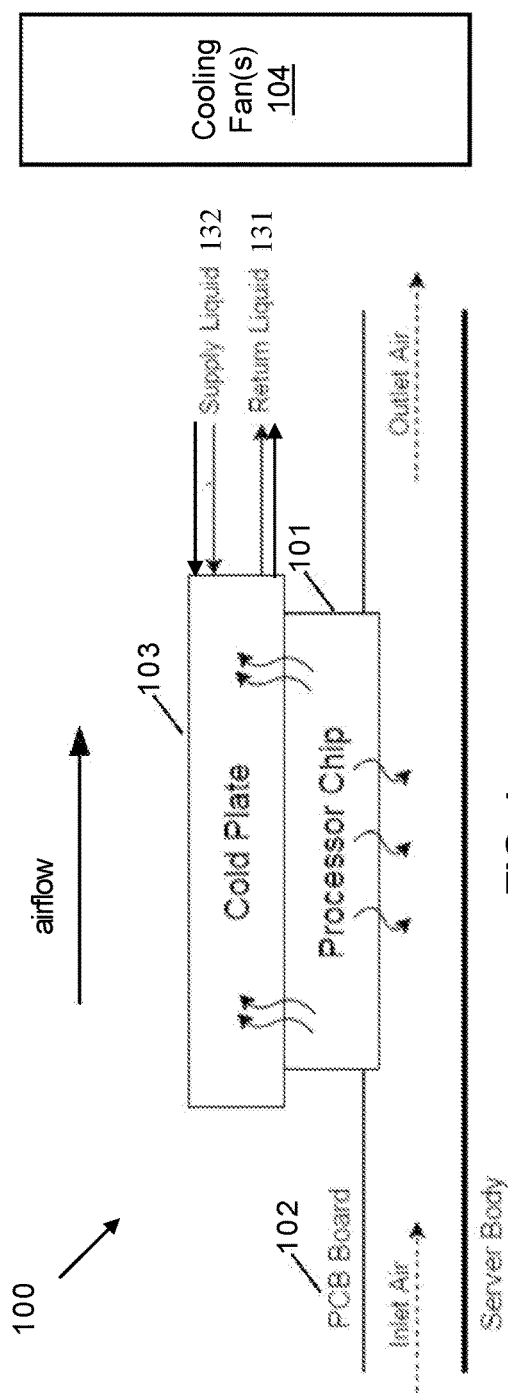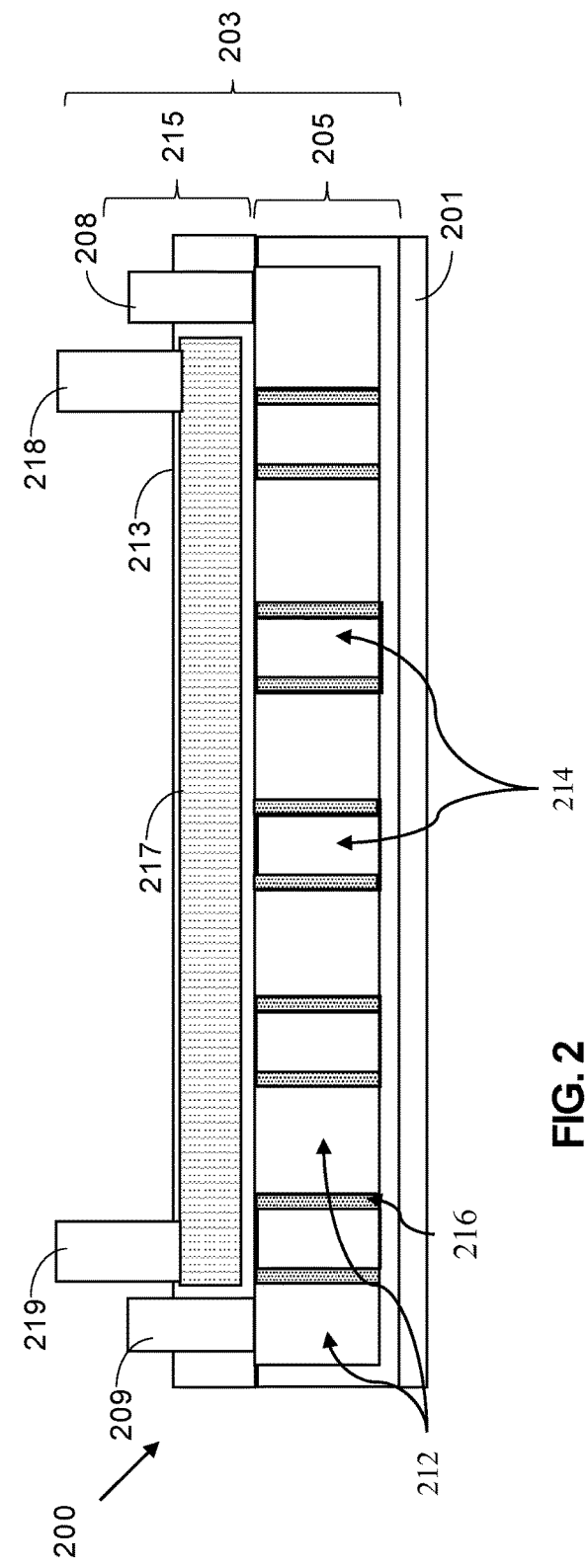

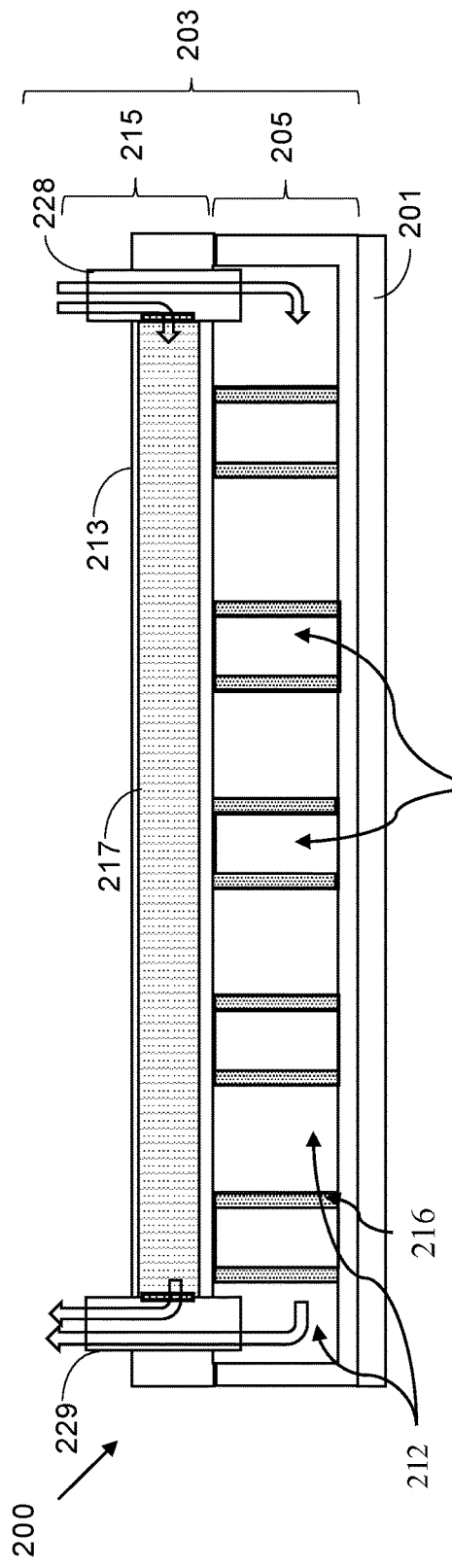
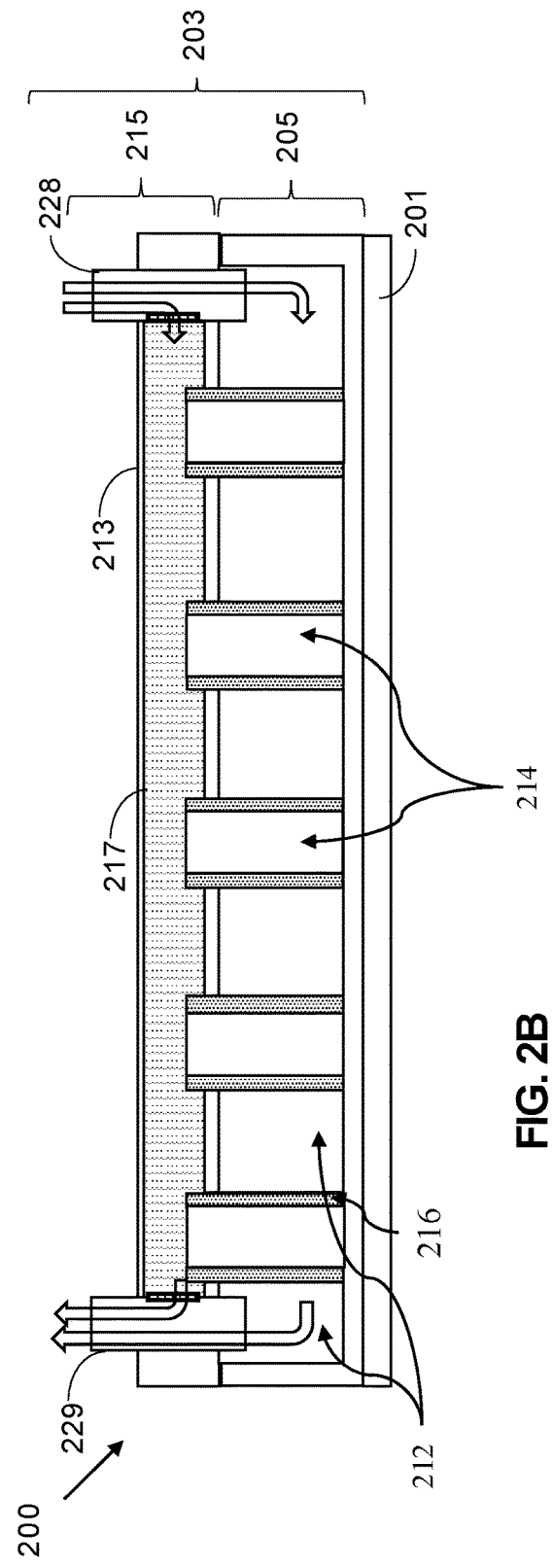
FIG. 2A
FIG. 2B

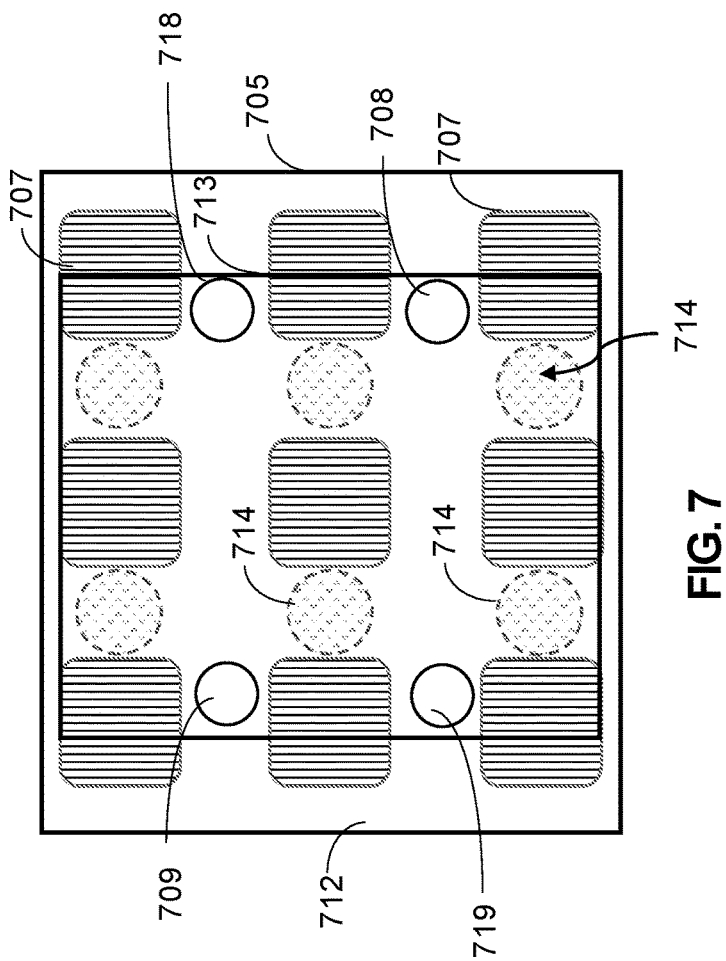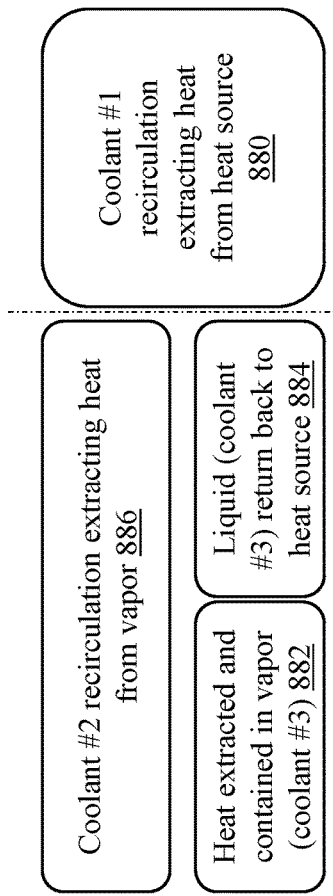
FIG. 7
FIG. 8

CHIP COOLING PACKAGE WITH MULTIPLE FLUID PATHS

FIELD OF THE INVENTION

Embodiments of the present invention relate generally to enhanced and reliable cooling of advanced chips that require liquid cooling.

BACKGROUND

Cooling is a prominent factor in a computer system and data center design. The number of high performance electronic components, such as high performance processors packaged inside servers, has steadily increased, thereby increasing the amount of heat generated and dissipated during the ordinary operations of the servers. The proper operation of these processors is highly dependent on reliable removal of the heat they generate. Thus, proper cooling of the processors can provide high overall system reliability.

Electronics cooling is very important for computing hardware and other electronic devices, such as CPU servers, GPU servers, storage servers, networking equipment, edge and mobile system, on-vehicle computing box and so on. All these devices and computers are used for critical businesses and are the fundamentals of a company's daily business operations. The design of the hardware component and electronics packaging needs to improve to continuously support the performance requirements. Cooling of these electronic devices becomes more and more challenging to ensure that they function properly by constantly providing properly designed and reliable thermal environments.

Many advanced chips, and especially high power density chips, require liquid cooling. These chips are exceedingly expensive, so that every effort needs to be taken to ensure proper heat removal from these chips. Moreover, the liquid cooling equipment must be highly reliable, since any irregularity in heat removal may lead to loss of the chips, causing loss of available computing power during the replacement operation, and even potential impact on the service level agreement which was handled by the lost chips. Importantly, existing solutions for electronics cooling and thermal management for processor do not provide redundancy on the module level, which means that they are a single failure point in the system. Specifically, failure to properly circulate cooling fluid within the cooling plate can lead to a failure of the corresponding processor. Therefore, enhanced reliability may be achieved by developing full end to end redundant cooling solutions for the chips, such that a single failure can be backed up by the designed in redundancy.

While liquid cooling solution must provide the required thermal performance and reliability, since data centers may have thousands of chips requiring liquid cooling, the cost of the liquid cooling system must remain acceptable. The cost of liquid cooling systems may include the cost of introducing redundancy to enhance reliability. Additionally, since different chips have different cooling requirements, it would be desirable to provide a cooling design that is adaptable and expandable to fit different server architectures and be compatible with different chip packaging.

BRIEF DESCRIPTION OF THE DRAWINGS

Embodiments of the invention are illustrated by way of example and not limitation in the figures of the accompanying drawings in which like references indicate similar elements.

FIG. 1 is a block diagram illustrating an example of a cold plate configuration according to one embodiment.

FIGS. 2-2B are schematics illustrating a cross-section of a cooling plate according to various embodiments.

FIG. 7 is a top view schematic illustrating a cooling plate according to an embodiment.

FIG. 8 is a conceptual schematic illustrating the cooling functionality of a cold plate according to an embodiment.

DETAILED DESCRIPTION

Figure 3:
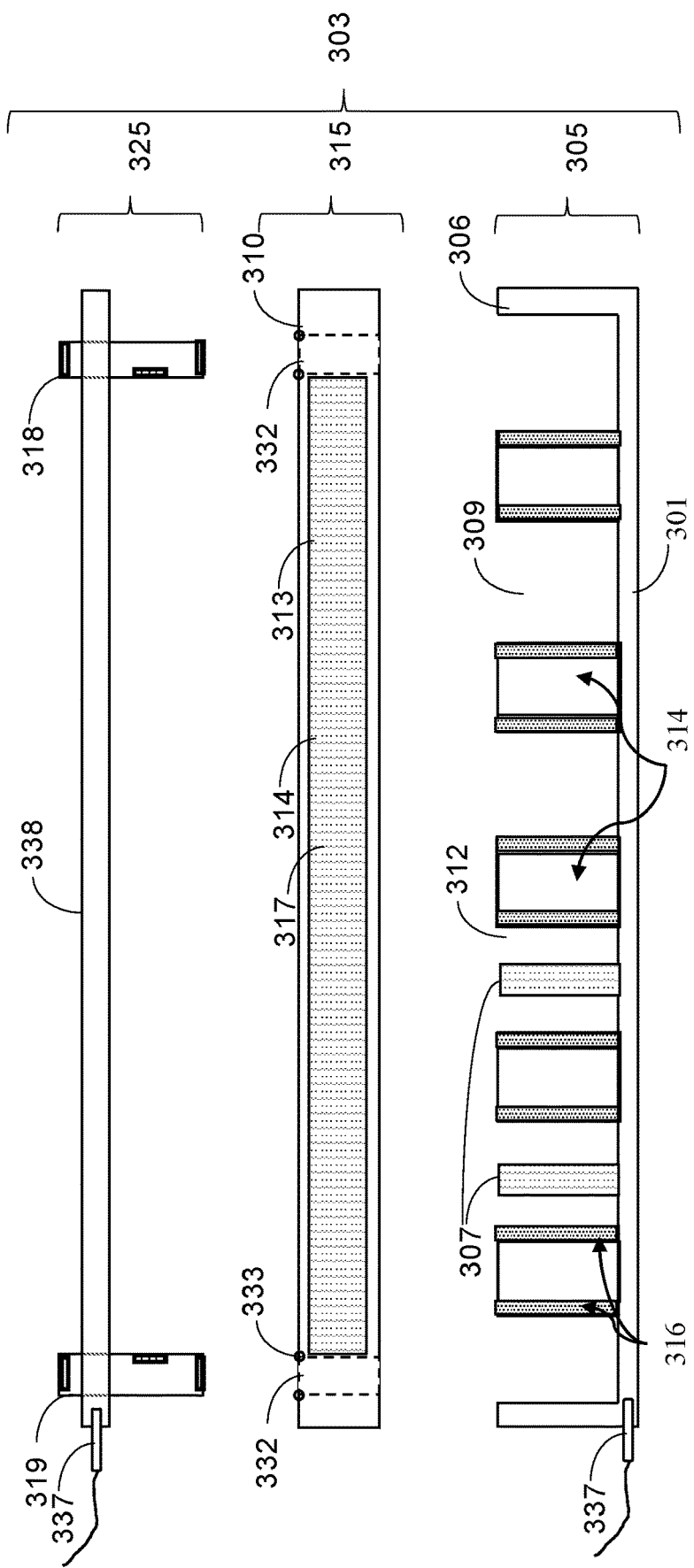
FIG. 3 illustrates an embodiment of fabricating and assembling a cold plate, prior to final assembly into a packaged design.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Incidentally, in the following embodiments similar elements are identified with similar reference numbers in the formal x##, wherein the first digit x is replaced by the same digit as the figure number, while the next two digits ## are maintained consistent among the embodiments. Consequently, explanation of previously disclosed elements may not be repeated in subsequent embodiments.

Disclosed embodiments provide cooling plate for electronic devices, which utilizes multiple circulation loops and/or multi-phase cooling to enhance the reliability of the cooling system. Additionally, multiple-path liquid delivery system is included to provide redundancy and flexibility to the liquid delivery system. The multiple-path liquid delivery system also enables implementation of the cooling plate in standard installations having only a single supply and return lines for the cooling plates. The cooling plate with multi-path delivery system may be implemented for cooling various electronic devices, such as single-chip module (SCM), system on a chip (SoC), multi-chip module (MCM), System in package (SIP), etc. For brevity, these are referred to herein as chips or simply chips, but any such reference should be understood to include any of these and similar variances of dies and packaging.

In various disclosed embodiments, the cooling plate includes fluid ports that incorporate multiple orifices couple to separate cooling loops within the plate. Additionally, the embodiments may incorporate multiple phase or phase change cooling cells in parallel with the cooling loops. Such embodiments enhance the heat transfer of the cooling plate and enhance the overall performance of the cooling system. In embodiments where two-phase cooling cells are used, one fluid cooling loop may be used to extract heat directly from the chip, while another fluid cooling loop may be used to indirectly extract heat from the chip contained within the vapor by cooling the vapor in the two-phase cells as it condenses back to liquid. The cooling liquid for these two loops may be delivered from different orifices of the input port and then return via two different orifices of the return port. The structure and functions of these and other features would be described below in more details, starting with a general description of a chip cooling plate system.

FIG. 1 is a schematic diagram illustrating a chip cold plate configuration that may be implemented or modified according to embodiments disclosed herein. The chip/cold plate assembly 100 can represent any processors/cold plate structures of servers or other computing platforms incorporating fluid cooling. Referring to FIG. 1, chip 101 (e.g., an ASIC) is plugged onto a socket mounted on printed circuit board (PCB) or motherboard 102 coupled to other electrical components or circuits of a data processing system or server. For fluid cooling, chip 101 also includes a cold plate 103 attached to it, which is coupled to a rack manifold that is coupled to liquid supply line 132 and/or liquid return line 131, e.g., via blind mate connectors. A portion of the heat generated by chip 101 is removed by the cold plate 103. The remaining portion of the heat enters into an air space underneath or above, which may be removed by an airflow generated by cooling fan 104, when so equipped.

FIG. 2 is a side cross-section of a cooling assembly 200, which incorporate multiple-loop cooling plate 203, wherein each loop includes independent input and output ports. Cooling plate 203 may perform direct and indirect heat removal from the chip 201. Cooling plate 203 is an example of a cooling plate that can directly benefit from embodiments of the fluid ports that incorporate multiple orifices disclosed herein.

Cooling plate 203 includes a bottom or core plate 205 and a top or secondary plate 215. The bottom plate 205 and top plate 215 may be made of thermally conductive material, e.g., copper, aluminum, etc. The bottom surface of the bottom plate 205 is in physical contact with the chip packaging 201 and the top surface of the bottom plate 205 is in physical contact, e.g., adhered, soldered, welded, integral to, etc., with the top plate 215. Notably, the interfaces between the bottom plate 205 and chip 201 and between the bottom plate 205 and the top plate 215 should be made highly thermally conductive.

The bottom plate 205 includes one or more fluid channels 212 through which cooling fluid from a cooling system circulate. Immersed among the fluid channels 212 are a plurality of two-phase cooling cells 214, which may be formed as thermosiphon structures. In one embodiment the channels 212 may be simply defined or formed by the placement and orientation of the cells 214, as will be further shown below. The two-phase cooling cells 214 are self-contained and are sealed, such that no fluid flows into or out of the cells 214. Rather, the fluid at the bottom of each cell gets heated up by the chip 201 and evaporation occurs. The vapor rises to the top surface of the bottom plate 205 where it condenses and then flow back down. In this example, this process is enhanced by the provision of wicking material or structure 216 inside the cells 214. Thus, the bottom plate extracts heat from the chip 201 partially by the fluid circulating within the fluid channels 212 and partially by the evaporation action inside the two-phase cells 214.

In this embodiment, the bottom plate 205 transfers some of the heat removed from chip 201 to top plate 215. The top plate of this embodiment comprises cooling channels 213 that receive separately circulating cooling fluid, separately from the fluid circulation of the bottom plate 205. Here, the fluid channels 213 of the top plate 215 incorporate fins 217 for enhanced heat removal. As cooling fluid circulates within the top plate 215, it keeps the top plate cold by extracting heat through the bottom of the top plate, thus enhancing the condensation action in the two-phase cells 214 of the bottom plate 205. By this action, the heat extracted from the chip 201 by the cells 214 is at least partially transported to the top plate, the heat is then extracted by the cooling fluid in cooling channels 213, this can be understood as that the heat generated from the chip is indirectly removed by the cooling fluid in cooling channels 213.

As shown in FIG. 2, two separate inlet and outlet ports are provided in order to have redundant cooling fluid delivery to the cooling plate 203. Specifically, inlet port 208 delivers cooling fluid to the bottom plate 205 while inlet port 218 delivers cooling fluid to the top plate 215. Similarly, outlet port 209 returns fluid from the bottom plate 205 while outlet port 219 return cooling fluid from the top plate 215. By having this redundancy, even if one fluid circulation system fails, heat can still be removed from the chip by the remaining circulating system. For example, if circulation of fluid in the cooling channels 212 stops, the fluid remaining stationary in the cooling channels 212 would heat up by the heat from the chip 201. Since the fluid in the top plate continues to circulate and keep the top plate cold, the heat from the fluid in channels 212 would be transferred to the fluid circulating in cooling channels 213. In one embodiment, the fluid ports can be design on the other side of the cooling plate 203.

The redundancy of the two cooling fluid loops, while advantageous, requires two separate fluid delivery lines and fluid return line, which are not always available, or which may increase complexity and cost. The following embodiments provide the advantages of the multiple cooling loops, without the need for multiple liquid supply and return lines.

FIG. 2A illustrates an embodiments of a cooling plate having fluid ports that incorporate multiple orifices couple to separate cooling loops within the plate. Specifically, inlet port 228 is a three-way port, in that it has one inlet orifice and two outlet orifices fluidly coupled to the inlet orifice. Thus, liquid supplied to the inlet port flows partially to cooling channels 213 and partially to cooling channels 212, as illustrated by the arrows. Return port 229 is also a three-way port, having two inlet orifices fluidly coupled to a single return orifice, such that the liquid in channels 212 and 213 can be returned via the same return port 229, as also illustrated by the arrows. In this manner, while cooling plate 203 incorporate two separate cooling regions, both regions can be provided with circulating cooling fluid using a single supply port and a single return port.

Thus, an arrangement of a chip and a cooling plate is provided, wherein the heat generated by the chip is partially removed directly from the chip by a first or primary cooling fluid loop, and heat generated by the chip is also partially removed indirectly from the chip by a second cooling fluid loop which circulates cooling fluid independently of the primary cooling loop; wherein an inlet port supplies cooling liquid to both the primary and secondary cooling loops, and a return port collects cooling fluid from both the primary and secondary cooling loops.

Moreover, to further enhance redundancy and flexibility in the system, the cooling plate 203 may be provided with more than one inlet port and one outlet ports. For example, two inlet ports and two outlet ports may be provided. However, since FIG. 2A is a two-dimensional illustration, the second set of inlet and outlet ports are obscured as they are positioned directly behind the first set of inlet and outlet ports 228 and 229 illustrated in FIG. 2A. In case more than one set of inlet and outlet ports are provided, at least one of the sets should be structured with multiple orifices, as explained with respect to ports 228 and 229.

In FIG. 2A the two-phase cooling cells have their ceiling abut the secondary cooling channels so as to remove the heat from the vapor inside the cells. Conversely, FIG. 2B illustrates an embodiment similar to that of FIG. 2A, except that the top portion of each of the two-phase cells extends into the secondary cooling channels 213, such that cooling fluid flowing within the secondary cooling channels 213 contact and cool the top portion of the cells directly, thereby enhancing heat transfer from the cells. That is, the two-phase cells are partially immersed in the primary cooling channels and partially immersed in the secondary cooling channels. Therefore, in this embodiment the cooling liquid flowing in channels 213 directly enhance the condensation of the vapor within the two-phase cells 214.

FIG. 3 illustrates an exploded view of a cooling plate assembly 303 according to an embodiment. The embodiment of FIG. 3 is, of course, but only one example of fabricating the cooling plate assembly, and other manners of fabricating it may be utilized. The embodiment of FIG. 3 comprises of three major parts: a base 305, an intermediate section 315, and a top assembly 325. These three parts are joined together by, e.g., weld, adhesive, solder, snaps, etc.

The base is fabricated in the form of a tub 306, having bottom plate 301 and sidewalls 306 defining a fluid cavity 309 therein. One or more sets of fins 307 may be attached inside the fluid cavity to introduce flow resistance. Also, two-phase cooling cells 314 are attached, e.g., welded, to the bottom plate 301. In this embodiment the two-phase cells incorporate wicking structure 316. The shape, positioning, and orientation of the two-phase cells 314 can be used to define the fluid channels 312. That is, the fluid flowing in the cavity 309 would follow the paths defined by the fins 307 and the cells 314, thus the fins 307 and the cells 314 together define the channels 312.

The intermediate section 315 has a sealing plate 310 that, when attached on top of the base 305 seals the fluid cavity 309. To ensure highly thermally conductive interface between the cells 314 and the sealing plate 310, it would be beneficial to provide physical attachment, such as bonding, solder, weld, etc., between the top of each cell 314 to the bottom of the sealing plate 310. Further, secondary fluid cavity 313 is formed in the interior of sealing plate 310, and fins 317 may be formed in the fluid cavity 313, thereby defining fluid channels 314. Also, port cavities 332 are formed in the seal plate 310, positioned so as to accept the three-way ports 318 and 319 upon assembly. Port cavities 332 are through-holes that pass through the seal plate 310, such that upon assembly the three-way ports extend beyond the bottom surface of the seal plate and into the fluid cavity 309 of the base.

The top assembly 325 includes a lid 338 and one or more sets of the three-way ports 318 and 319. The lid 338 is structured to be attached to the seal plate 310, while supporting the ports 318 and 319 in alignment to be inserted through the port cavities 332. Once the ports 318 and 319 are inserted through the port cavities 332, a seal should be formed there-between, so as to prevent leaks. This can be achieved by permanent bonding or use of seals.

In FIG. 3 leak detection sensors 337 may be included to provide early detection of leaks from the various elements of the cooling plate assembly 303. In an embodiment, the leak detection sensor can be designed to be implemented between each to contact surface of the base, the intermediate plate and the top layer. For example, sensors 337 may be positioned to enable leak detection from the interfaces between the base 305, the intermediate plate 315 and the top assembly 325. Also, O-ring 333 or other sealing arrangement may be provided to seal the interface between the ports 318 and 319 and the port cavities 332.

Figure 4:
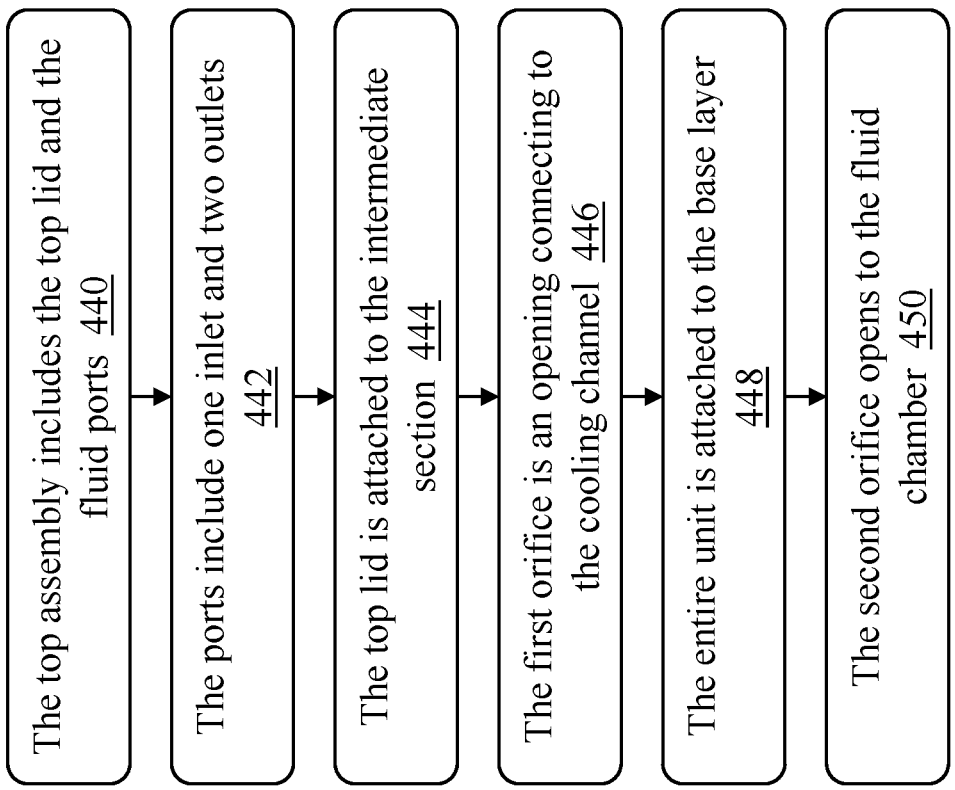
FIG. 4 is a flow chart for assembling and packaging the cold plate.

FIG. 4 is a flow chart illustrating assembly of a cooling plate, such as the cooling plate shown in FIG. 3. At 440 the top assembly if formed by the top lid and the fluid ports. As noted in 442, each of the ports is a three-way port, such that the inlet port has one inlet and two outlets, while the outlet port has two inlets and one outlet. The top assembly may include more than one inlet port and one outlet port. In 444 the top lid is attached to the intermediate section as the fluid ports are inserted through the port cavities in the intermediate section. The top lid and the fluid ports are sealed to the intermediate section. As noted in 446, when the top lid is attached to the intermediate section, one orifice of each fluid port is fluidly connected to the fluid channels within the intermediate section. In 448 the assembly of the top lid and intermediate section is attached to the base section, so that a second orifice of each fluid port is extended into the fluid chamber of the base section, as indicated by 450.

Thus, a method for fabricating a cooling plate for chip is provided, comprising: providing a first metal plate and forming primary cooling channel in the first metal plate to thereby fabricate a primary cooling plate; providing a second metal plate and forming secondary cooling channel to thereby fabricate a secondary cooling plate; attaching the top plate to the bottom plate; fabricating at least one set of inlet port and outlet port, wherein each of the inlet port and outlet port forms a three-way fluid passage, inserting the inlet port and outlet port through the secondary plate to the primary plate, such that one of the three-way fluid passages forms a fluid passage to the primary cooling channel and a second of the three-way fluid passages forms a fluid passage to the secondary cooling channel.

Figure 5:
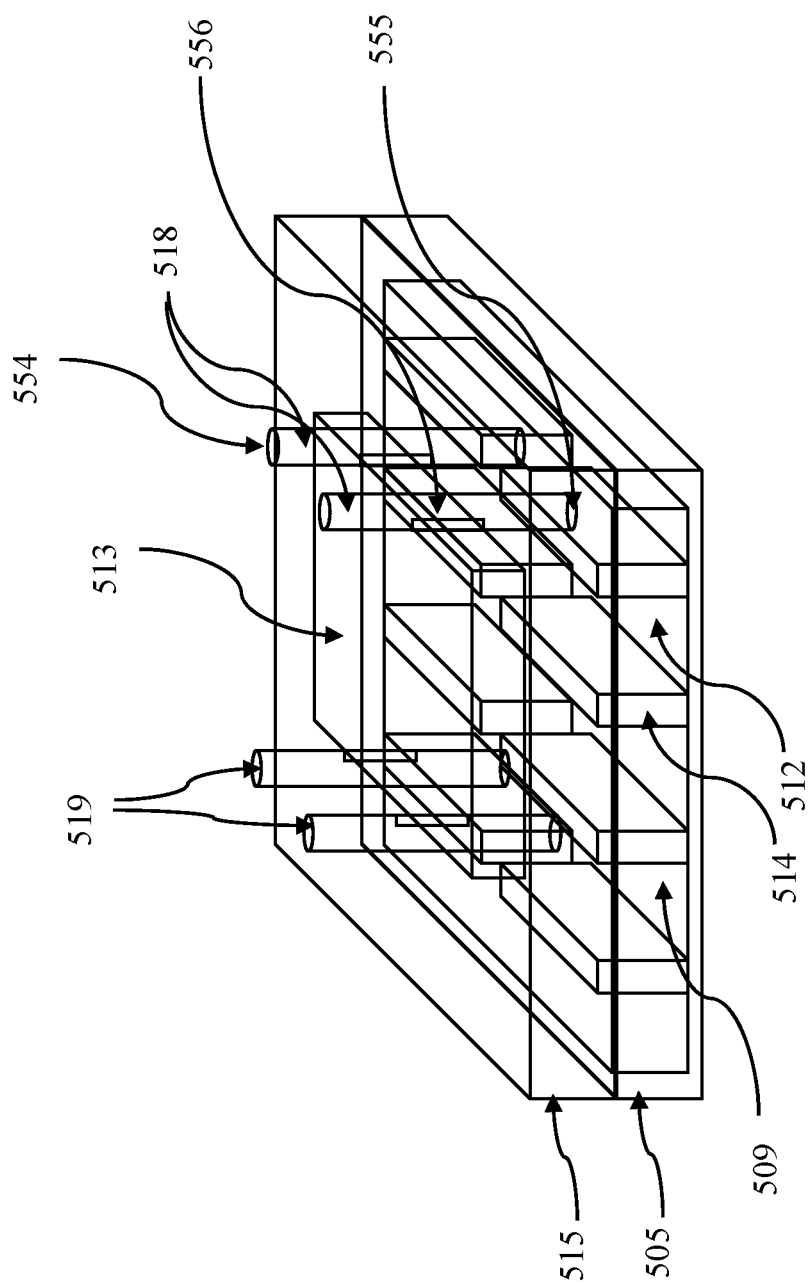
FIG. 5 is a transparent view illustrating an embodiment of a cold plate.

FIG. 5 is a transparent isometric view of an embodiment utilizing more than one sets of inlet and outlet ports. As illustrated in FIG. 5, fluid cavity 509 is formed in a base plate to fabricate the primary cooling plate 505. Two-phase cells 514 are arranged inside the fluid cavity 509 thereby defining the primary fluid channels 512. A secondary cooling plate 515 is attached on top of the primary cooling plate, and has secondary fluid cavity 513. Two sets of inlet ports 518 and return port 519 are provided, wherein each port is in the form of a fluid conduit having three orifices. Each of the ports is inserted through the secondary plate 515 into the primary fluid cavity 509, such that one orifice 555 provides fluid communication to the primary fluid cavity, while a second orifice 556 provides fluid communication to the secondary fluid cavity. The third orifice 554 is used to exchange cooling liquid with a liquid cooling system (as shown in FIG. 1).

Thus, according to disclosed embodiments, a cooling plate for cooling chips is provided, comprising: a bottom plate incorporating a primary fluid cooling arrangement, wherein the primary fluid cooling arrangement comprises primary fluid cooling channels formed in the bottom plate; a top plate attached to the bottom plate and having a secondary fluid cooling arrangement fluidly separated from the primary fluid cooling arrangement, wherein the secondary fluid cooling arrangement comprises fluid cooling channels formed in the top plate; at least one fluid inlet port fluidly coupled to the primary fluid channels and the secondary fluid channels; and at least one fluid outlet port fluidly coupled to the primary fluid channels and the secondary fluid channels.

Figure 6:
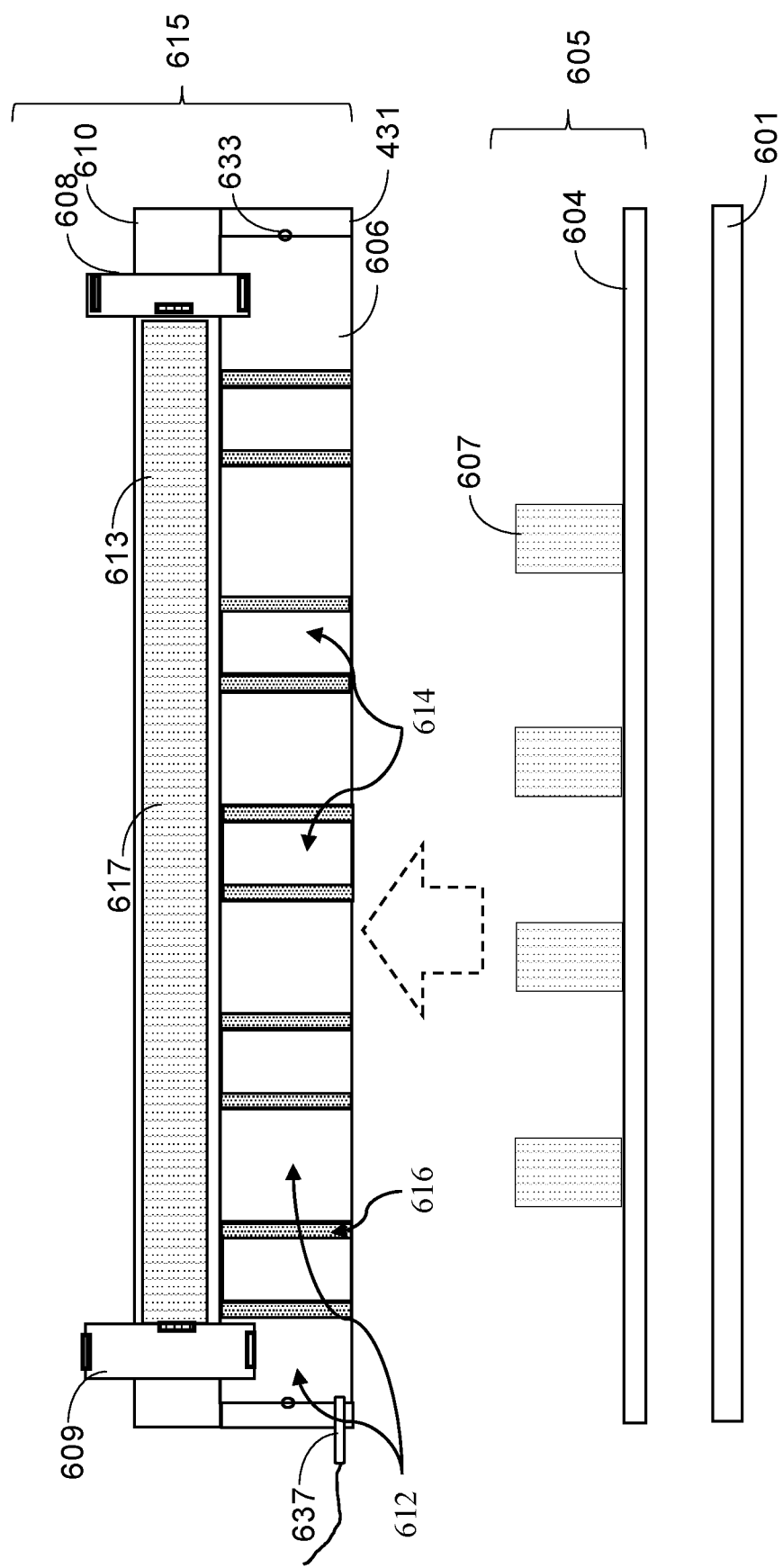
FIG. 6 illustrates an exploded view of a cooling plate, according to an embodiment.

FIG. 6 illustrates yet another embodiment for fabricating, assembling and packaging the cooling plate. In the embodiment of FIG. 6, the primary cooling plate 605 has fins 607 attached to sealing base plate 604. The two-phase cells 614 are attached to the bottom fluid cavity 606 formed in the secondary cooling plate 615, such that when the bottom fluid cavity 606 is sealed by the base plate 604 the two-phase cells 614 fit in between the fins 607, thereby defining the fluid channels 612. A secondary fluid cavity 613 is formed in the upper part of the secondary cooling plate 615, and it may include fins 617. In this embodiment, at least one set of intake and outlet ports, 608, 609 are provided on the top plate 615. As in other embodiments, each of the inlet and outlet ports 608 and 609 have three orifices, such that one orifice leads to the primary fluid cavity 606, while another orifice leads to the secondary fluid cavity 613. The third orifice leads to the fluid circulating system, such as supply and return lines 132 and 131 shown in FIG. 1.

FIG. 6 also illustrate a sealing ring 633 that can be used to seal the bottom plate to the top plate. Additionally, a sensor 637 may be provided. The sensor may be, e.g., a temperature sensor to monitor the temperature of the fluid in the primary or secondary cooling channels. Alternatively, or additionally, the sensor may be a leak sensor to provide an alert should the seal fail and a leak develops.

FIG. 7 is a top "transparent" view of a cooling plate according to an embodiment. In this view some structural elements have been omitted in order to highlight the heat removal function of this cooling plate. The cooling fluid delivered via each of the inlet ports 708 and 718 exits through the orifices, one leading to secondary fluid cavity 713 and one leading to the primary fluid cavity 712. The fluid then exits through the two orifices provided in each return ports 709 and 719. Meanwhile, fins 707 are provided within the flow area 712 to increase heat delivery to the fluid flowing within the primary fluid cavity 712. The number, size and orientation of the fins can be designed so as to deliver the proper flow resistivity required for proper heat transfer without overloading the pump in the cooling loop.

The two-phase cells 714 may be distributed within the flow area 712, such that some heat may be transferred from the cells 714 to the fluid in area 712. However, much of the heat from the cells 714 is intended to be transferred to the fluid flowing in the secondary fluid cavity 713. The fluid is delivered to secondary cavity 713 via inlet ports 708 and 718 is returned to the loop via outlet ports 709 and 719, thus transporting the heat from the cells 714 out through outlet ports 709 and 719. This enhances the condensation action of the fluid within the self-contained two-phase cells 714.

FIG. 8 is a block chart further illustrating the heat removal using the cooling plate disclosed herein. The dash-dot line indicates the two independent heat removal processes which act independently and simultaneously to provide redundant heat removal loops. The coolant supplied by inlet ports is split by the two outlet orifices, such that the part flowing through the primary cooling plate is referred to as coolant #1, while the part flowing through the secondary cooling plate is referred to as coolant #2. Coolants #1 and #2 are the same cooling fluid that is returned via the return ports to the cooling system. It also can be understood as that coolant #1 is stream #1 and coolant #2 is stream #2, and stream #1 and #2 are from the same coolant. Conversely, each of the two-phase cells contains coolant, referred to as coolant #3. Each of the two-phase cells is a self-contained unit and cooling liquid is not delivered to or removed from the cells.

To the right of the dash-dot line is the circulation of coolant #1, which circulates within fluid channels of the bottom plate and remove heat directly from the heat source, i.e., the processor. To the left side of the dash-dot line is a two-step process for removing further heat from the source. The first step is the removal of heat by the evaporation of coolant #3 within the two-phase cells. The heat is then transferred from coolant #3 to coolant #2 by the condensation of the vapor of coolant #3. That heat is then transported out by coolant #2, while the condensed coolant #3 flows back to the bottom of each two-phase cell, optionally via the wicking structure. In this sense, fluid #2 indirectly removes heat from the chip.

Thus, by the disclosed embodiments, a cooling device incorporating two independent cooling channels using common supply and return ports is provided. The cooling device comprises a bottom plate having primary fluid channels for directly removing heat from the chip. A top plate is attached to the bottom plate and includes a secondary cooling channels for indirectly removing heat from the chip and for providing redundant cooling loop. At least one set of fluid inlet and outlet ports are provided, each having multiple orifices to simultaneously circulate cooling fluid in the primary channel and in the secondary channel. A plurality of two-phase cells may be provided in the bottom plate that, by evaporation and condensation action of the fluid contained therein transfer heat from the chip to the fluid circulating in the secondary fluid channels. The cooling device is attached to a chip or incorporated in chip packaging.

According to further disclosed aspects, method for fabricating a cooling plate for chip is provided, comprising: providing a first metal plate and forming primary cooling channel in the first metal plate to thereby fabricate a bottom plate; providing a second metal plate and forming secondary cooling channel to thereby fabricate a top plate; fabricating a set of inlet and outlet ports, each having three orifices such that when inserted in the top plate, the one orifice provides fluid passage to the secondary cooling channel and a second orifice forms fluid passage to the primary cooling channel; attaching the top plate to the bottom plate; and, attaching the inlet and outlet ports to the top plate so as to extend to the primary cooling channels in the bottom plate.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling plate for cooling chips, comprising:
   a bottom plate incorporating a primary fluid cooling arrangement, wherein the primary fluid cooling arrangement comprises primary fluid channels formed in the bottom plate;
   a top plate attached to the bottom plate and having a secondary fluid cooling arrangement fluidly separated from the primary fluid cooling arrangement, wherein the secondary fluid cooling arrangement comprises secondary fluid channels formed in the top plate; and,
   at least one fluid inlet port having a first orifice fluidly coupled to the primary fluid channels and a second orifice fluidly coupled to the secondary fluid channels, and at least one outlet port having a first orifice fluidly coupled to the primary fluid channels and a second orifice fluidly coupled to the secondary fluid channels.

2. The cooling plate of claim 1, wherein the primary fluid cooling arrangement further comprises a plurality of two-phase cooling cells.

3. The cooling plate of claim 2, wherein the primary fluid cooling arrangement further comprises cooling fins arranged in the primary cooling channels.

4. The cooling plate of claim 3, wherein the cooling fins and the two-phase cells are arranged in alternating positions.

5. The cooling plate of claim 2, wherein the plurality of two-phase cells are partially immersed within the primary fluid channels and partially immersed in the secondary fluid channels.

6. The cooling plate of claim 5, wherein the secondary fluid channels comprise cooling fins.

7. The cooling plate of claim 2, wherein each of the two-phase cooling cells comprise a thermosiphon structure.

8. The cooling plate of claim 1, the at least one fluid inlet port comprising two fluid inlet ports, each having a first orifice fluidly coupled to the primary fluid channels and a second orifice fluidly coupled to the secondary fluid channels, and the at least one fluid outlet port comprising two outlet ports, each having a first orifice fluidly coupled to the primary fluid channels and a second orifice fluidly coupled to the secondary fluid channels.

9. The cooling plate of claim 1, further comprising a sealing ring provided between the top plate and the bottom plate.

10. The cooling plate of claim 1, further comprising a leak detection unit.

* * * * *